PARAMETRIC LUMPED CIRCUIT FLUID AMPLIFIER
Filed Oct. 21, 1965
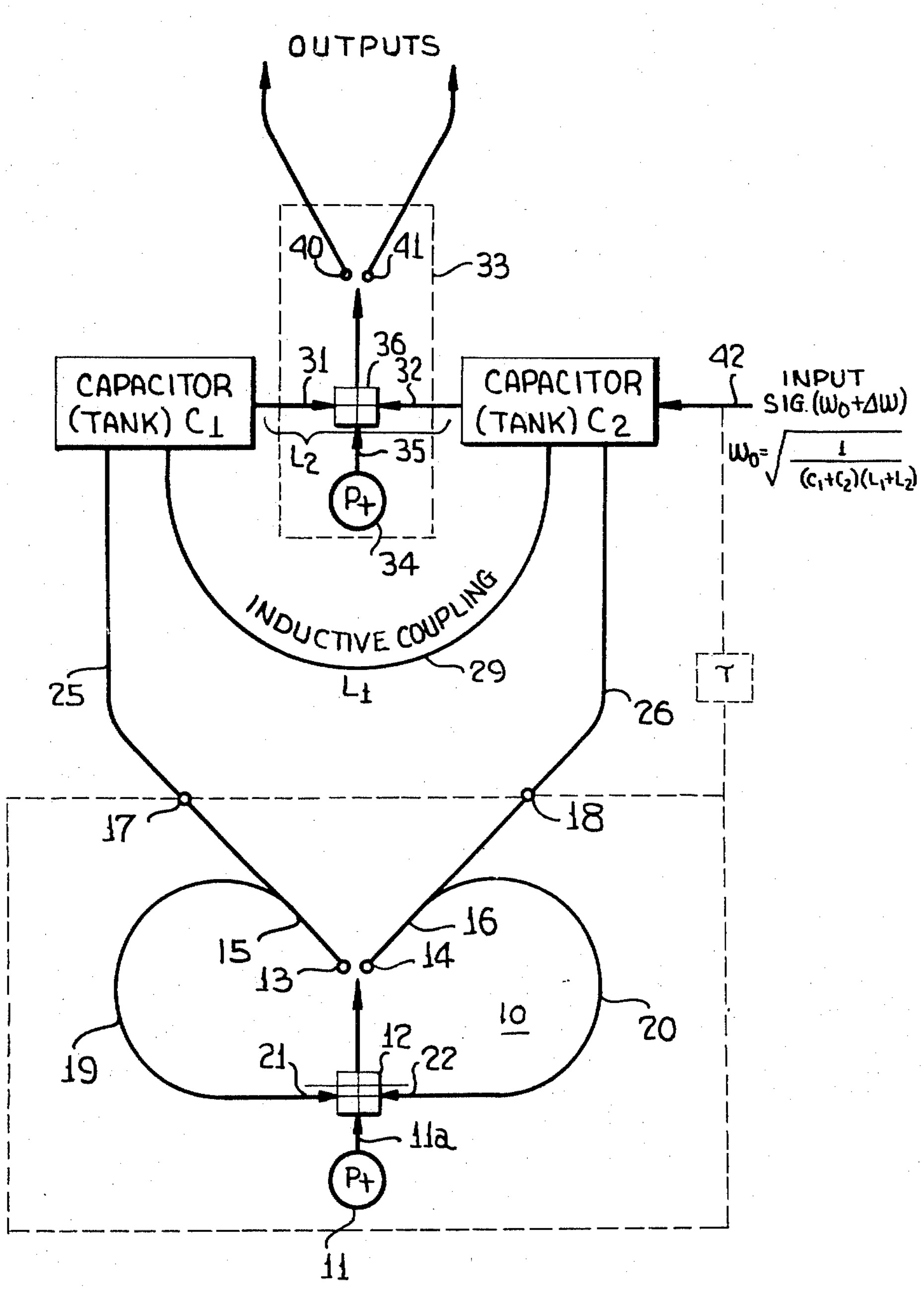
INVENTOR
ERIC E. METZGER
BY Hurvitz & Rose
ATTORNEYS

1

3,527,240

PARAMETRIC LUMPED CIRCUIT FLUID AMPLIFIER

Eric E. Metzger, Silver Spring, Md., assignor to Bowles Engineering Corp., Silver Spring, Md., a corporation of Maryland Filed Oct. 21, 1965, Ser. No. 499,342
Int. Cl. F15c *4/00*
U.S. Cl. 137—81.5 4 Claims

ABSTRACT OF THE DISCLOSURE

A parametric fluid amplifier employing fluid capacitance as signal responsive parameter, the fluid capacitance being resonated by fluid inductance to the frequency of a pump signal, the signal subject to amplification having less than half the pump frequency. The fluid amplifier is of the type having a deflectable jet of fluid proceeding through an interaction area to differential output passages, the input signal proceeding to a control nozzle through the variable fluid capacitance.

The present invention relates generally to parametric fluid amplifiers, and more particularly to purse fluid amplifiers which operate on principles analogous to those utilized in electrical parametric amplifiers of the solid state type.

Parametric amplification takes place when the value of a reactive element in a circuit supporting a signal frequency is varied in such fashion that energy from a source external to the signal circuit is stored in the reactive element and enhances the signal. In the case of electrical parametric amplifiers the storage element may be a voltage dependent capacitance, such as a varactor, or in general may depend on the bulk properties of certain solid state materials, i.e. ferromagnetic and ferroelectric materials.

A simple mechanical model of a parametric amplifier utilizing capacitance as the parametric variable, is one in which the plates of a capacitor in a resonant circuit are mechanically separated each time the charge storage is maximum and restored each time the charge is zero. The essential feature of the device is that an alternating force is applied to vary the reactive element. In one type of parametric amplifier energy of the AC source or pump can be transferred to the signal only if the pump and signal have the proper phase relation, and if the pump frequency is exactly twice the signal frequency. Since this may be difficult to achieve, the signal frequency is usually made lower than half the pump frequency, and the circuitry is designed with sufficient bandwidth to support a resonance at a difference frequency, between pump and signal frequencies, called the idler frequency.

It is an object of the present invention to provide a pure fluid parametric amplifier.

In pure fluid devices a fluid capacitor may consist of an enclosure, capable of sustaining compressible fluid. The capacitance of such an enclosure is a function of fluid pressure in the tank, and accordingly a pump signal, which may be the output of a pure fluid oscillator, can be applied to the enclosure to modify its capacitance at oscillator frequency. The oscillator is then the pump of a fluid parametric amplifier. The parametric amplifier itself may be a pure fluid analog amplifier of the momentum interchange type, having two output and two control ports. Separate fluid capacitors may be connected to the control ports and interconnected via a fluid inductance such as to resonate the capacitances to the pump frequency. Pump power may be provided by a pure fluid oscillator, and control signal at a frequency properly selected with respect to the pump frequency may be applied to one of the capacitances. The described construction then represents an analog of an electrical parametric amplifier.

2

It is, accordingly, a feature of the invention to provide a parametric pure fluid amplifier utilizing lumped fluid capacitances as the time variable reactances of the amplifier.

The above and still further objects, features and advantages of the present invention will become apparent upon consideration of the following detailed description of one specific embodiment thereof, especially when taken in conjunction with the accompanying drawing, wherein:

The single figure of the drawing is a block diagram of a parametric amplifier according to the invention. In the figure, 10 is a conventional pure fluid oscillator, including a source of fluid 11, which supplies fluid under pressure to a power nozzle **11*a*. The latter supplies a main jet of fluid which flows through an interaction region 12 toward differential collection ports 13, 14. The latter communicates with output channels 15, 16 terminating in output ports 17, 18. Feedback paths 19, 20 exist from the output channels 15, 16, to control nozzles 21, 22. The latter issue transverse control jets into the interaction region 12, in intersecting relation to the main jet. The capacitance and inductance of paths 19, 20 maintain oscillations in oscillator 10** at a frequency W*o*.

The output ports 17, 18 communicate, via ducts 25, 26 with pure fluid capacitors 27, 28, interconnected via an inductive loop 29. The capacitors 27, 28 are essentially enclosures capable of sustaining fluid under pressure, and have capacitances $C_1$ and $C_2$, respectively, and the loop 29 has an inductance $L_1$, such that the components resonate at the frequency W*o*, where $$Wo=\sqrt{\frac{1}{(C_1+C_2)(L_1+L_2)}}$$

where $L_2$ are stray inductances associated with the capacitors. The combination of line 29 and lines 25, 26 pumps and sucks fluid in alternation, into and from tanks 27, 28, and large pressure variations are developed due to the resonance condition, which are 180° out of phase in the two capacitors. The pressure variations produce flow in control nozzles 31, 32 of a pure fluid analog amplifier 33, of the momentum interchange type. The latter includes a source of fluid 34 and a power nozzle 35 which issues a stream of the fluid into an interaction region 36. Control nozzles 31, 32 issue opposed jets, which interact in the interaction region with the main jet and affect its directivity.

The fluid issuing from control nozzles 31, 32, cause the main jet flowing from power nozzle 35, to be collected differentially in collection ports 40, 41 of amplifier 33.

On insertion via duct 42 of an AC fluid signal into the capacitor 28, the signal having a frequency lower than half the pump frequency, a difference or idler frequency appears. The Q of the resonant system must then be selected sufficiently low to support the idler frequency. A necessary phase relationship between pump and signal is now automatically maintained, as is known from the electrical analog, and operation is known as "non-degenerate." In this condition higher db gain exists for amplifier 33 at signal frequency, than would be expected from amplifier 33 per se, without increase of noise.

I claim:

1. A pure fluid parametric amplifier, comprising a pure fluid analog type amplifier including a power nozzle issuing a power jet into an interaction region, a pair of control nozzles directing control fluid into said interaction region in opposite senses and in interacting relation to said power jet, a resonant pure fluid circuit connected to said control nozzles in push-pull relation, said pure fluid circuit including pure fluid reactance, said pure fluid reactance being variable in value as a funution of fluid control signal, means for applying said control signal as a pump signal to said pure fluid reactance at a resonant frequency W*o* of said resonant circuit, whereby the values of said reactance varies at said frequency W*o* alternately above and below an average value, and means supplying AC fluid signal to said reactance for amplification by said amplifier.

2. The combination according to claim 1 wherein said AC fluid signal has a frequency lower than half the pump frequency.

3. The combination according to claim 1 wherein said reactance includes capacitance.

4. The combination according to claim 1 wherein said reactance includes a separate capacitor connected in series with each of said control nozzles and inductive interconnection means coupling said separate capacitors, the resonant frequency of said resonant pure fluid circuit being determined by the capacitances of said capacitors and the inductance of said inductance interconnection means.

References Cited

UNITED STATES PATENTS

| | | | |
|---|---|---|---|
| 3,159,168 | 12/1964 | Reader | 137—81.5 |
| 3,185,166 | 5/1965 | Horton et al. | 137—81.5 |
| 3,199,782 | 8/1965 | Shinn | 131—81.5 XR |
| 3,228,410 | 1/1966 | Warren et al. | 137—81.5 |
| 3,233,522 | 2/1966 | Stern | 137—81.5 XR |
| 3,273,377 | 9/1966 | Testerman et al. | 137—81.5 XR |
| 3,275,015 | 9/1966 | Meier | 137—81.5 |
| 3,320,966 | 5/1967 | Swartz | 137—81.5 |

SAMUEL SCOTT, Primary Examiner